United States Patent
Kayser et al.

(10) Patent No.: US 10,509,603 B2
(45) Date of Patent: Dec. 17, 2019

(54) HIERARCHICAL VARIABLE CODE RATE ERROR CORRECTION CODING

(71) Applicant: WESTERN DIGITAL TECHNOLOGIES, INC., Irvine, CA (US)

(72) Inventors: Scott Thomas Kayser, San Diego, CA (US); Majid Nemati Anaraki, San Diego, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 91 days.

(21) Appl. No.: 15/331,666

(22) Filed: Oct. 21, 2016

(65) Prior Publication Data

US 2018/0034476 A1 Feb. 1, 2018

Related U.S. Application Data

(60) Provisional application No. 62/368,973, filed on Jul. 29, 2016.

(51) Int. Cl.
  *H03M 13/11* (2006.01)
  *G06F 3/06* (2006.01)
  *H03M 13/00* (2006.01)

(52) U.S. Cl.
  CPC .......... *G06F 3/0679* (2013.01); *G06F 3/064* (2013.01); *G06F 3/0619* (2013.01);
  (Continued)

(58) Field of Classification Search
  CPC .......... G06F 11/1076; G06F 11/1008; G06F 11/106; G06F 3/064; G06F 3/0679;
  (Continued)

(56) References Cited

U.S. PATENT DOCUMENTS 5,621,761 A * 4/1997 Heegard ............. H04L 27/3433
  341/106
7,502,987 B2 3/2009 Kyung et al.
(Continued)

FOREIGN PATENT DOCUMENTS

CN 102571105 B 3/2014
WO WO-2009/078514 A1 6/2009

OTHER PUBLICATIONS

Jacobsen et al., "Design of Rate-Compatible Irregular LDPC Codes Based on Edge Growth Parity Splitting," 2007 IEEE Vehicular Technology Conference, pp. 1052-1056.
(Continued)

*Primary Examiner* — Samir W Rizk
*Assistant Examiner* — Enam Ahmed
(74) *Attorney, Agent, or Firm* — Morgan, Lewis & Bockius LLP

(57) ABSTRACT

A system for hierarchical variable code rate error correction coding may include at least one circuit that is configured to identify a row of a hierarchical portion of a generator matrix that corresponds to a determined code rate, determine a number of information bits to apply to the hierarchical portion based at least on the identified row, and apply the determined number of information bits to the identified row. The circuit may be further configured to apply an output of the identified row to a subsequent row of the hierarchical portion, when the hierarchical portion includes a subsequent row, and apply an output of a last row of the hierarchical portion to a base portion of the generator matrix. The circuit may be further configured to provide a codeword output by the base portion of the generator matrix.

20 Claims, 11 Drawing Sheets

(52) U.S. Cl.
CPC ........ *H03M 13/116* (2013.01); *H03M 13/118* (2013.01); *H03M 13/6393* (2013.01)

(58) Field of Classification Search
CPC . G06F 3/0619; G06F 11/1068; H05K 999/99; G11C 2029/0411; H03M 13/1111; H03M 13/616; H03M 13/6393; H03M 13/118; H03M 13/116
USPC .......................................................... 714/764
See application file for complete search history.

(56) References Cited

U.S. PATENT DOCUMENTS

| | | |
|---|---|---|
| 7,802,164 B2 | 9/2010 | Hong et al. |
| 7,802,172 B2 | 9/2010 | Vila Casado et al. |
| 7,930,622 B2 | 4/2011 | Oh et al. |
| 8,086,929 B2 | 12/2011 | Chung et al. |
| 8,631,299 B2 | 1/2014 | Sugihara et al. |
| 2005/0060343 A1* | 3/2005 | Gottsman ............. G06F 16/338 |
| 2008/0168329 A1* | 7/2008 | Han ................... G06F 11/1012 714/764 |
| 2010/0281355 A1* | 11/2010 | White .................... G06Q 30/02 715/222 |
| 2010/0325511 A1 | 12/2010 | Oh et al. |
| 2012/0191640 A1* | 7/2012 | Ebadollahi ........... G06N 99/005 706/53 |
| 2013/0283117 A1* | 10/2013 | Yang ..................... H03M 13/13 714/752 |
| 2016/0070498 A1* | 3/2016 | Ly ........................ G06F 3/0616 714/764 |
| 2016/0142074 A1* | 5/2016 | Sham .................... H04L 1/0052 714/776 |
| 2017/0366341 A1* | 12/2017 | Hu ........................ H04L 9/0869 |

OTHER PUBLICATIONS

Joo et al., "New Construction of Rate-Compatible Block-Type Low-Density Parity-Check Codes Using Splitting," 17th Annual IEEE International Symposium on Personal, Indoor and Mobile Radio Communcations, 2006, 5 pages.

Oh et al., "Row-Splitting Design of Low-Density Parity-Check Codes for Gbps Transmission," 2007 IEEE Vehicular Technology Conference, pp. 1127-1131.

Pandya et al., "Design of Variable-Rate Adaptive LDPC Codes for DVB-S2 Applications" ICWMMN 2006 Proceedings, 4 pages.

Vila Casado et al., "Multiple Rate Los-Density Parity-Cheek Codes with Constant Blocklength," 2004 IEEE, pp. 2010-2014.

* cited by examiner

HIERARCHICAL VARIABLE CODE RATE ERROR CORRECTION CODING

CROSS-REFERENCE TO RELATED APPLICATIONS

The present application claims the benefit of U.S. Provisional Patent Application Ser. No. 62/368,973, entitled "Hierarchical Variable Code Rate Error Correction Coding," filed on Jul. 29, 2016, which is hereby incorporated by reference in its entirety for all purposes.

TECHNICAL FIELD

The present description relates generally to error correction coding including hierarchical variable code rate error correction coding.

BACKGROUND

In devices that utilize variable code rate error correction, such as low-density parity-check (LDPC) error correction coding, separate parity check and generator matrices may be required for providing each of the different code rates. Thus, a device implementing variable code rates may need to locally store multiple different parity check and/or generator matrices. Furthermore, in some instances different encoders and decoders may be required for each of the different code rates and corresponding matrices.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

In the subject hierarchical variable code rate error correction coding system, a parity check matrix is generated for the highest code rate supported by the system. The rows of the highest code rate parity check matrix are split one or more times to generate a split parity check matrix that supports multiple code rates while preserving the codeword length and column weight for different code rates. The subject system then generates a generator matrix from the split parity check matrix and the highest code rate parity check matrix. The generator matrix is used in conjunction with hierarchical encoding/decoding techniques to provide for the multiple different code rates. In this manner, a device implementing the subject system only needs to store the single generator matrix, as opposed to storing different generator matrices for different code rates. Since the generator matrix is based on the highest code rate parity check matrix, the decoders for different code rates may also be based on the highest code rate parity check matrix with minimal changes, such as combining proper check nodes. Furthermore, the generator matrix may be sparse in most parts, thereby reducing the amount of memory required to store the generator matrix.

Figure 1:
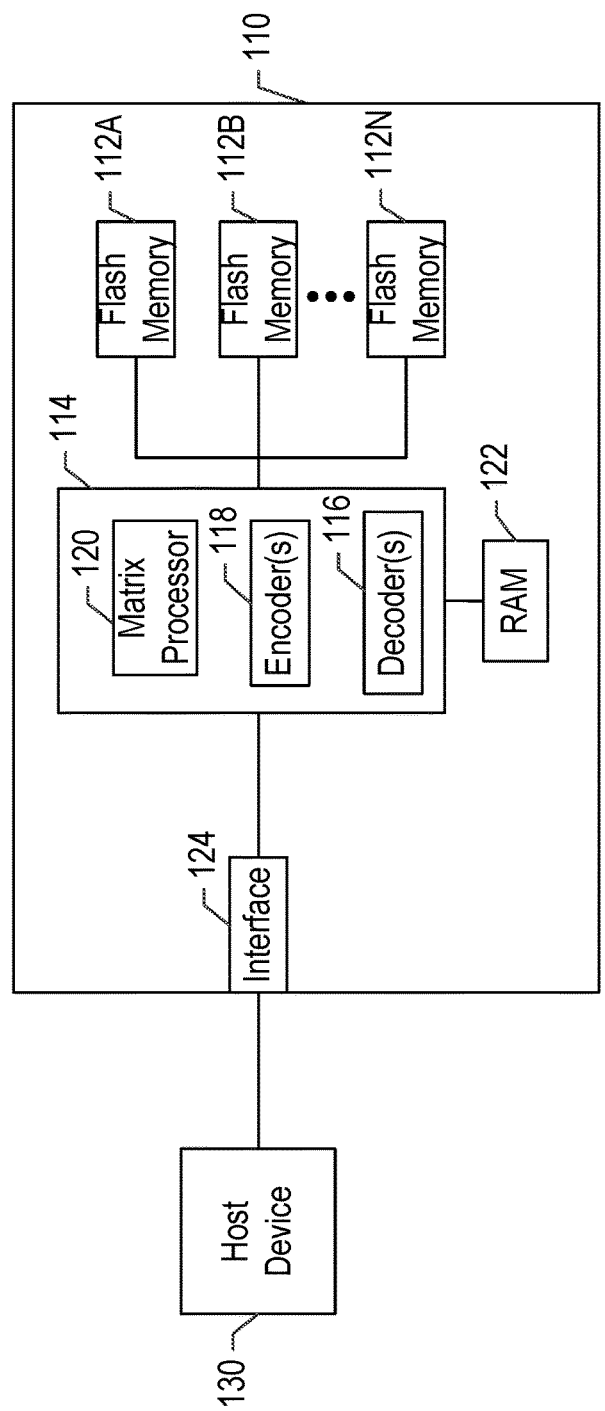
FIG. 1 illustrates an example flash memory system that may implement a hierarchical variable code rate error correction coding system in accordance with one or more implementations.

FIG. 1 illustrates an example flash memory system 100 that may implement a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The system 100 includes a flash memory device 110 and a host device 130. The flash memory device 110 includes one or more flash memory circuits 112A-N, a controller 114, a random access memory (RAM) 122 and an interface 124. The controller 114 includes a matrix processor 120, one or more decoders 116, and one or more encoders 118. One or more of the matrix processor 120, the one or more decoders 116, and/or the one or more encoders 118 may include and/or may be one or more dedicated circuits of the controller 114 and/or may be implemented via firmware running on the controller 114.

The flash memory device 110 and/or the host device 130 may include all or part of the electronic system described below with respect to FIG. 11. The interface 124 of the flash memory device 110 couples the flash memory device 110 to the host device 130. The interface 124 may be a wired interface, such as a Personal Computer Memory Card International Association (PCMCIA) interface, a Serial AT Attachment (SATA) interface, a universal serial bus (USB) interface, or generally any wired interface. Alternatively, or in addition, the interface 124 may be a wireless interface, such as wireless SATA, Bluetooth, or generally any wireless interface.

The controller 114 is operable to read data from, and write data to, the flash memory circuits 112A-N. The controller 114 may utilize the RAM 122 to assist with reading/writing data to/from the flash memory circuits 112A-N. For example, the RAM 122 may be used as a buffer for rate control, or may otherwise be used to store information (e.g. address mapping tables, memory management information, variables, settings, etc.) utilized by the controller 114 to read/write data to/from the flash memory circuits 112A-N. Since the RAM 122 may be volatile memory, the controller 114 may permanently store information in one or more of the flash memory circuits 112A-N. When the flash memory device 110 is powered on, the controller 114 may retrieve the information from the one or more flash memory circuits 112A-N and store the information in the RAM 122.

The controller 114 may implement one or more algorithms or techniques in conjunction with reading and/or writing data to the flash memory circuits 112A-N, such as security techniques (e.g. encryption), error correction coding techniques (e.g. LDPC), compression techniques, redundancy techniques (e.g. redundant array of independent disks (RAID) techniques), etc. For example, the controller 114 may use error correction coding to provide protection to data written to the flash memory circuits 112A-N. In this regard, the encoder 118 of the controller 114 may encode data received from the host device 130 into codewords at a code rate indicated by the controller 114. The controller 114 then writes the codewords to the one or more of the flash memory circuits 112A-N. When the controller 114 subsequently reads the codewords from the one or more of the flash memory circuits 112A-N, the decoder 116 of the controller 114 decodes the codewords into data that is provided by the controller 114 to the host device 130 via the interface 124.

Since the integrity of the flash memory circuits 112A-N degrades with use over time, thereby increasing the raw bit error rate (RBER) associated with data read from the flash memory circuits 112A-N, the code rate used by the encoder 118 also needs to change, e.g. decrease, to provide additional protection to data written to the flash memory circuits 112A-N. For example, the flash memory circuits 112A-N may be designed to reliably store data over a maximum number of program-erase (P/E) cycles, and the integrity of the flash memory circuits 112A-N may degrade as the flash memory circuits 112A-N approach or surpass the maximum number of P/E cycles. In order to account for this degradation over time/use, the controller 114 utilizes variable code rate error correction coding where the code rate used by the encoder 118 decreases as the integrity of the flash memory circuits 112A-N degrades, thereby providing additional protection to the data. The subject system may also be used in a wireless transmission system in order to account for different amounts of interference in a wireless channel.

In order to determine the appropriate code rate to use at any given time, the controller 114 may monitor the integrity of the flash memory circuits 112A-N. The monitoring may be based on, for example, the RBER associated with data read from the flash memory circuits 112A-N, and/or a priori empirical data regarding the life expectancy of the flash memory circuits 112A-N, e.g. the maximum number of P/E cycles that the flash memory circuits 112A-N are designed to reliably perform. When the controller 114 determines that the integrity of the flash memory circuits 112A-N has degraded below a threshold amount, the controller 114 may change (e.g. decrease) the code rate used by the encoder 118 to perform the error correction coding. In one or more implementations, the controller 114 may store a table, such as in the RAM 122, that includes associations between different RBER thresholds or P/E cycle counts and different code rates. In this manner the controller 114 can adaptively change the code rate as the monitored RBER or P/E cycle count changes.

The encoder 118 performs error correction coding, such as LDPC error correction coding, using a generator matrix that is generated from a parity check matrix for a given code rate. The generator matrix is used to generate codewords while the parity check matrix is used to verify whether a particular vector is a valid codeword. The generator and parity check matrices each include rows of circulant matrices, also referred to as circulants. A circulant matrix is a matrix in which each descending diagonal from left to right is constant and each row vector is rotated one element to the right relative to the preceding row vector.

Since the parity check matrix and the generator matrix are typically generated for a specific code and code rate, the use of variable code rates for error correction coding may require the use of different parity check and generator matrices. The matrices may be stored in the flash memory circuits 112A-N, and cached into the RAM 122 when the flash memory device 110 is powered on. However, some of these matrices may be dense and may require a significant amount of storage space which may impact the amount of data that can be stored in the flash memory circuits 112A-N and may increase the size of the RAM 122 needed in the system. Furthermore, encoding data using the different generator matrices may require different encoders, which may necessitate additional and/or different processing resources in the controller 114.

In the subject system, the generator matrix is generated, e.g. by the matrix processor 120, from a parity check matrix generated for the highest code rate supported by the controller 114. The generator matrix is generated such that the same generator matrix can be utilized with hierarchical encoding to encode data at different code rates while preserving the codeword length and column weight for the different code rates. Thus, only a single generator matrix, which is mostly sparse, needs to be stored in the flash memory circuits 112A-N. The generator matrix may include a base portion that is generated from the highest code rate parity check matrix, and a hierarchical portion that is generated from a split version of the highest code rate parity check matrix. The base portion of the generator matrix is used to encode at the highest code rate and one or more rows of the hierarchical portion of the generator matrix are used to encode at different lower code rates. Thus, as the code rate decreases, the number of rows of the generator matrix utilized by the encoder 118 increases.

The encoder 118 may perform hierarchical encoding using the generator matrix by identifying a number of rows of the hierarchical portion that are required for a given code rate, and then hierarchically encoding a number of information bits using the identified number of rows. The encoder 118 may start with the highest row being used and may use the output of each row as an input to the next lower row (from top to bottom) until the last row of the hierarchical portion is reached. The output of the last row of the hierarchical portion of the generator matrix is then applied to the main portion of the generator matrix to generate a codeword for the code rate. An exemplary process for performing hierarchical encoding is discussed further below with respect to FIG. 2.

The decoder 116 can be configured to decode codewords at varying code rates based at least in part on the parity check matrix used to generate the generator matrix. For example, the parity check matrix can be utilized to determine the proper check nodes to combine to achieve various different code rates. An exemplary process for decoding at varying code rates is discussed further below with respect to FIG. 3, and an example tanner graph illustrating an exemplary combination of check nodes is discussed further below with respect to FIG. 8.

The generator matrix may be generated to be relatively sparse, thereby taking up only a small amount of space in the flash memory circuits 112A-N. An example process of generating the generator matrix is discussed further below with respect to FIGS. 4-6 for a single split of the parity check matrix, and FIGS. 8 and 9 for multiple splits of the parity check matrix. An exemplary split parity check matrix and corresponding generator matrix are discussed further below with respect to FIG. 7. For explanatory purposes, the generation of the generator matrix is described herein as being performed by the matrix processor 120 of the controller 114. However, alternatively or in addition to being generated by the matrix processor 120, the generator matrix and/or the parity check matrix may be generated by a separate/external device and/or processor and then stored in one or more of the flash memory circuits 112A-N, e.g. via the interface 124.

In one or more implementations, one or more of the flash memory circuits 112A-N, the controller 114, the decoder 116, the encoder 118, the matrix processor 120, the RAM 122, and/or the interface 124, and/or one or more portions thereof, may be implemented in software (e.g., firmware, subroutines, and/or code), may be implemented in hardware (e.g., an Application Specific Integrated Circuit (ASIC), a Field Programmable Gate Array (FPGA), a Programmable Logic Device (PLD), a controller, a state machine, gated logic, discrete hardware components, and/or any other suitable devices) and/or a combination of both.

Figure 2:
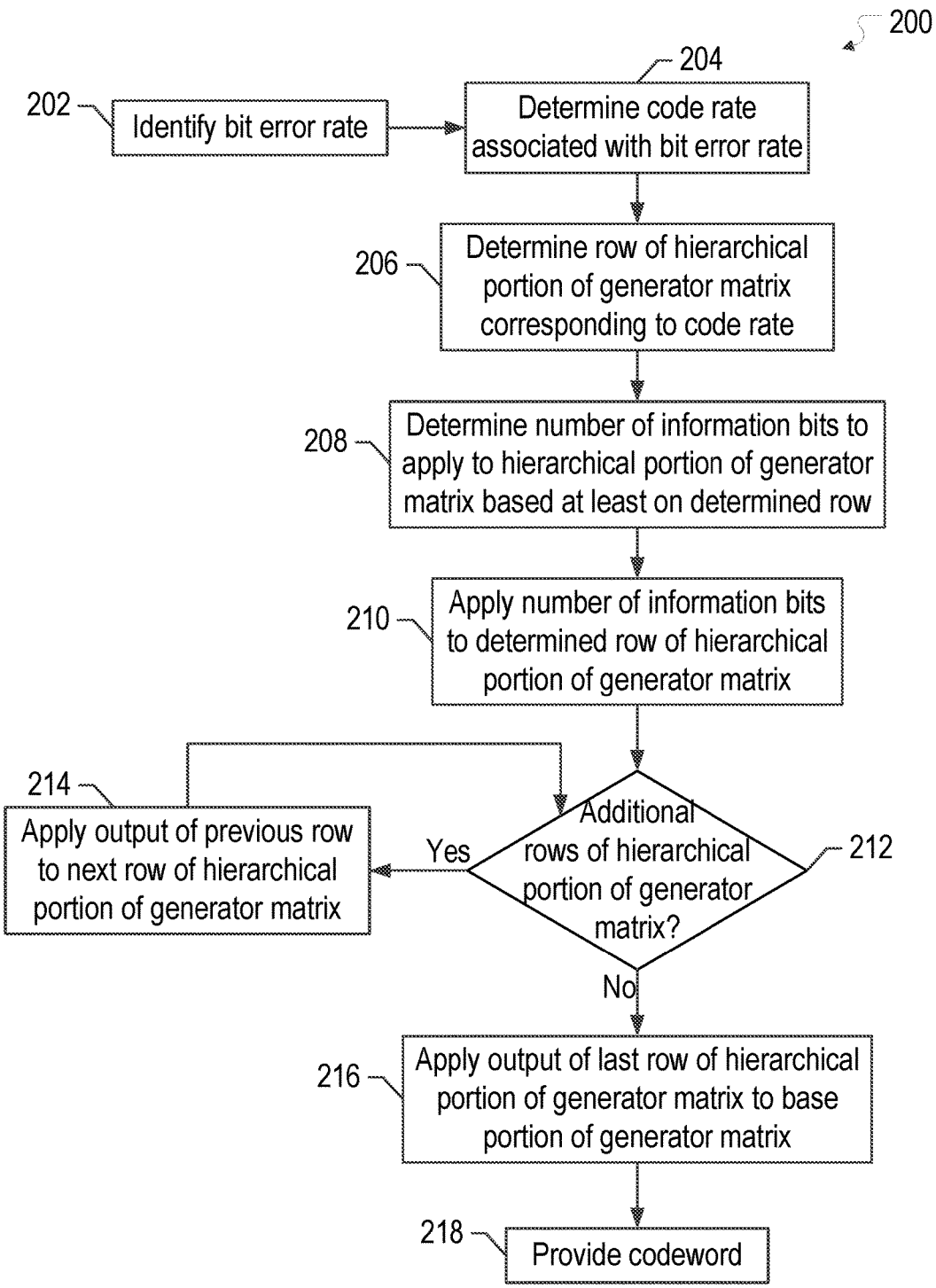
FIG. 2 illustrates a flow diagram of an example process of hierarchical variable code rate error correction encoding in accordance with one or more implementations.

FIG. 2 illustrates a flow diagram of an example process 200 of hierarchical variable code rate error correction encoding in accordance with one or more implementations. For explanatory purposes, the example process 200 is described herein with reference to the controller 114 and the encoder 118 of FIG. 1; however, the example process 200 is not limited to the controller 114 and/or the encoder 118 of FIG. 1, and one or more blocks of the example process 200 may be performed by one or more other components of the controller 114. Further for explanatory purposes, the blocks of the example process 200 are described herein as occurring in serial, or linearly. However, multiple blocks of the example process 200 may occur in parallel. In addition, the blocks of the example process 200 need not be performed in the order shown and/or one or more of the blocks of the example process 200 need not be performed.

Before encoding data, such as when the flash memory device 110 is powered on, or any time thereafter, e.g. periodically thereafter, the controller 114 identifies the bit error rate associated with the one or more flash memory circuits 112A-N, such as the RBER (202). For example, the controller 114 may monitor the bit error rate based on measured bit errors and/or by algorithmically determining a bit error rate based on a number of P/E cycles performed on the flash memory circuits 112A-N relative to the maximum number of P/E cycles that the flash memory circuits 112A-N are designed to reliably perform.

The controller 114 then determines the code rate associated with the identified bit error rate (204). For example, the controller 114 may retrieve the code rate associated with the identified bit error rate from a table, such as a table stored in one or more of the flash memory circuits 112A-N. In one or more implementations, the controller 114 may algorithmically determine the code rate, for example as a function of the identified bit error rate and the maximum bit error rate allowed, e.g. as indicated by design/performance specifications/guarantees associated with the flash memory device 110. The controller 114 also may determine the code rate based on the P/E cycle count associated with the flash memory circuits 112A-N instead of or in combination with the identified bit error rate.

The controller 114 determines the row of the hierarchical portion of the generator matrix that corresponds to the determined code rate (206). As discussed above, starting from the bottom of the hierarchical portion of the generator matrix, each row of the generator matrix may correspond to a particular code rate, where the code rate decreases with each subsequent row (from bottom to top). The code rates corresponding to each row may be algorithmically determinable and therefore may be known to the controller 114, e.g. by performing a code rate calculation and/or by retrieving stored code rate information.

The controller 114 determines the number of information bits to apply to the hierarchical portion of the generator matrix based at least on the determined row (208). The number of bits applied to each row may decrease (from bottom to top) as the code rate decreases, as is discussed further below with respect to FIGS. 6 and 7. For example, the number of information bits may be determinable from the number of non-null circulants in the determined row. The information bits may be, for example, data received from the host device 130 via the interface 124. The controller 114 provides the determined number of information bits to the encoder 118, and the encoder 118 applies the determined number of information bits to the determined row of the hierarchical portion of the generator matrix (210).

The encoder 118 then determines whether there are additional rows (from top to bottom) in the hierarchical portion of the generator matrix (212). If the encoder 118 determines that there are additional rows (212), the encoder 118 applies the output of the previous row as an input to the next row of the hierarchical portion of the generator matrix (214). Each additional row of the hierarchical portion of the generator matrix effectively adds additional parity information to the codeword being generated for the input information bits, thereby decreasing the code rate. The encoder 118 repeats this process until all of the remaining rows (from top to bottom) of the hierarchical portion of the generator matrix have been utilized.

When the encoder 118 determines that there are no additional rows of the hierarchical portion of the generator matrix (212), the encoder 118 applies the output of the last row of the hierarchical portion of the generator matrix to the base portion of the generator matrix to generate the complete codeword for the information bits (216). The encoder 118 then provides the codeword to the controller 114 (218) and the controller, e.g., writes the codeword to one or more of the flash memory circuits 112A-N.

Figure 3:
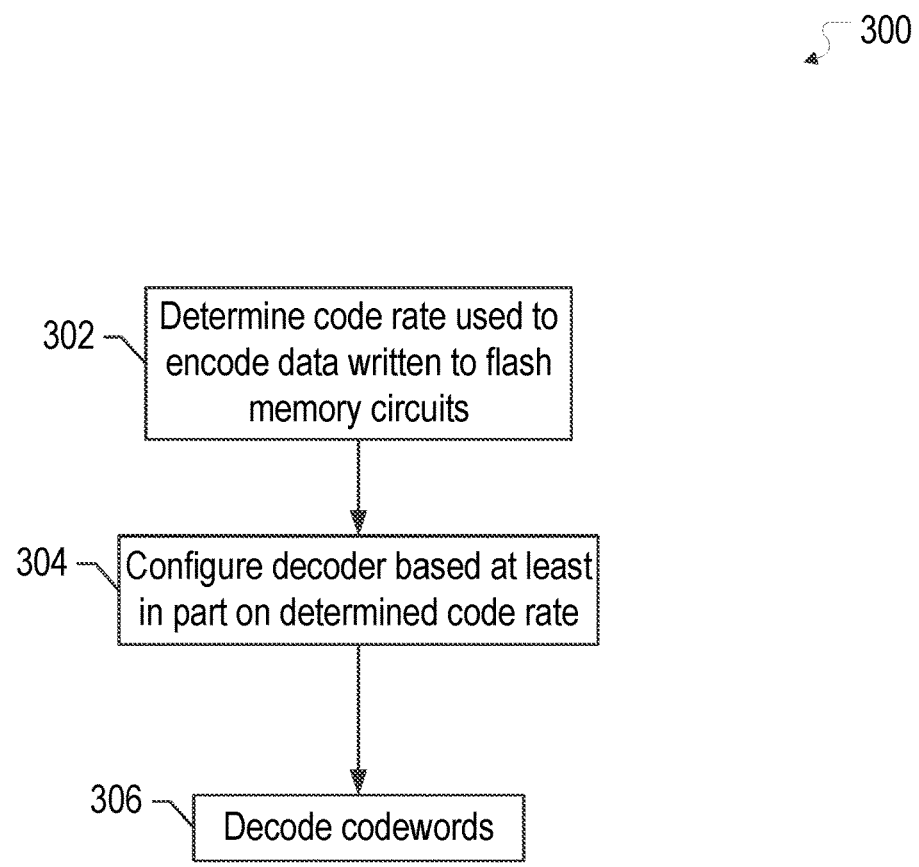
FIG. 3 illustrates a flow diagram of an example process of hierarchical variable code rate error correction decoding in accordance with one or more implementations.

FIG. 3 illustrates a flow diagram of an example process 300 of hierarchical variable code rate error correction decoding in accordance with one or more implementations. For explanatory purposes, the example process 300 is described herein with reference to the controller 114 and decoder 116 of FIG. 1; however, the example process 300 is not limited to the controller 114 and/or decoder 116 of FIG. 1, and one or more blocks of the example process 300 may be performed by one or more other components of the controller 114. Further for explanatory purposes, the blocks of the example process 300 are described herein as occurring in serial, or linearly. However, multiple blocks of the example process 300 may occur in parallel. In addition, the blocks of the example process 300 need not be performed in the order shown and/or one or more of the blocks of the example process 300 need not be performed.

For decoding the data, the controller 114 may keep track of the code rate used to encode data written to the flash memory circuits 112A-N and may determine, e.g. look up, the code rate used for encoded data to be read from the flash memory circuits 112A-N (302). The controller 114 configures the decoder 116 based at least in part on the determined code rate (304). For example, the controller 114 may combine and/or split one or more check nodes used by the decoder 116 as is discussed further below with respect to the tanner graph of FIG. 8 (304). The controller may then retrieve codewords from one or more of the flash memory circuits 112A-N and provide the codewords to the decoder 116. The decoder 116 may decode the codewords and provide the decoded information bits to the controller 114 (306), e.g. for transmission to the host device 130 via the interface 124.

Figure 4:
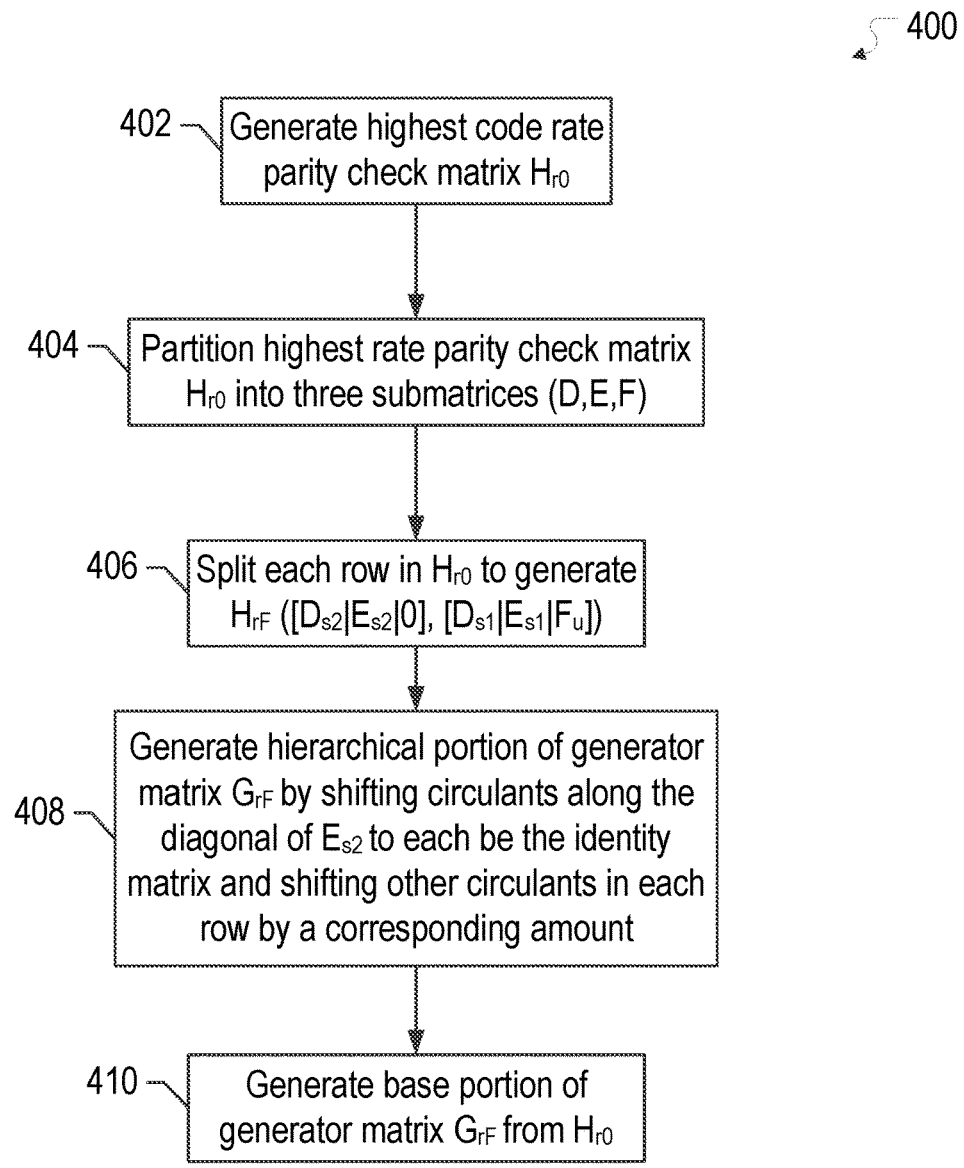
FIG. 4 illustrates a flow diagram of an example process of generator matrix generation in a hierarchical variable code rate error correction coding system in accordance with one or more implementations.

FIG. 4 illustrates a flow diagram of an example process 400 of generator matrix generation in a hierarchical variable code rate error correction coding system in accordance with one or more implementations. For explanatory purposes, the example process 400 is described herein with reference to the controller 114 and the matrix processor 120 of FIG. 1; however, the example process 400 is not limited to the controller 114 and/or the matrix processor 120 of FIG. 1, and one or more blocks of the example process 400 may be performed by one or more other components of the controller 114, one or more other components of the flash memory device 110, and/or by a device or system external to/separate from the flash memory device 110. Further for explanatory purposes, the blocks of the example process 400 are described herein as occurring in serial, or linearly. However, multiple blocks of the example process 400 may occur in parallel. In addition, the blocks of the example process 400 need not be performed in the order shown and/or one or more of the blocks of the example process 400 need not be performed.

The matrix processor 120 generates or retrieves from storage the highest code rate parity check matrix $H_{r0}$, where $r_0$ represents the highest code rate supported by the flash memory device 110 (402). The highest code rate parity matrix $H_{r0}$ may be designed such that any LDPC codes generated from $H_{r0}$ will share the same variable degree distribution, e.g. the column weight will be preserved, which may facilitate low complexity encoding and decoding of different code rates with minimal changes as the code rate changes.

The matrix processor 120 then partitions the highest code rate parity check matrix $H_{r0}$ into three submatrices (D,E,F) (404). An example partitioning of $H_{r0}$ into (D,E,F) is discussed further below with respect to FIG. 5. The matrix processor 120 then splits every row in the highest code rate parity check matrix $H_{r0}$ to generate the minimum code rate parity check matrix $H_{rF}$ which includes $[D_{s2}|E_{s2}|0]$ and $[D_{s1}|E_{s1}|F_u]$ (406). The rows are split so that the number of remaining short cycles is minimized and so that the column weights are preserved. An example of the split highest code rate parity check matrix $H_{rF}$ is discussed further below with respect to FIGS. 6 and 7.

The matrix processor 120 then generates the hierarchical portion of the generator matrix $G_{rF}$ by shifting the circulants along the diagonal of $E_{s2}$ to each be the identity matrix and shifting other circulants in each row by a corresponding amount (408). This operation may be equivalent to circularly shifting the entire row of circulants up or down, which only changes the parity check equation order. The matrix processor 120 then generates the base portion of the generator matrix $G_{rF}$ from the highest code rate parity check matrix $H_{r0}$ (410). An example generator matrix $G_{rF}$ is discussed further below with respect to FIG. 7.

In one or more implementations, the example process 400 may be performed by one or more devices and/or systems that are separate from, and/or external to, the flash memory device 110. After completing the example process 400, the one or more devices and/or systems may store the generated parity check matrix and/or the generated generator matrix in one or more of the flash memory circuits 112A-N of the flash memory device 110, such as via the host device 130, interface 124, and controller 114.

Figure 5:
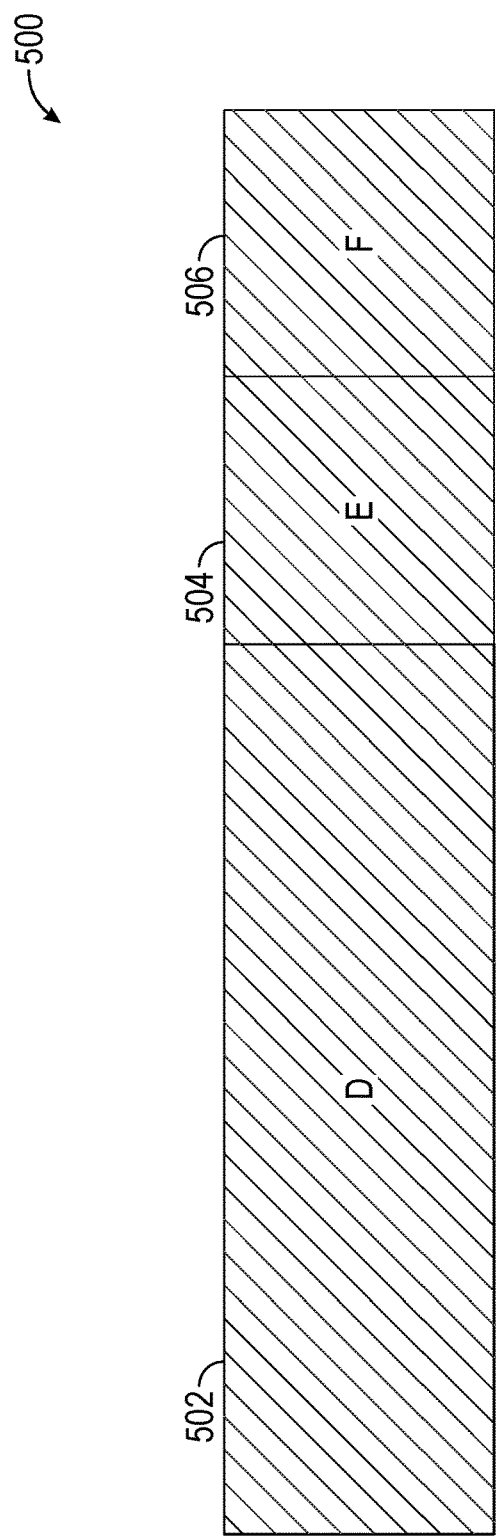
FIG. 5 illustrates a highest code rate parity check matrix 500 partitioned into submatrices in a hierarchical variable code rate error correction coding system in accordance with one or more implementations.

FIG. 5 illustrates a highest code rate parity check matrix $H_{r0}$ 500 partitioned into submatrices in a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The highest code rate parity check matrix $H_{r0}$ 500 is partitioned into a submatrix D 502 on the left and two square submatrices, a submatrix E 504 and a submatrix F 506, on the right. The highest code rate parity check matrix $H_{r0}$ 500 may be partitioned such that the submatrix E 504 has non-null circulants along its diagonal and the submatrix F 506 has a rank equal to the rank of the highest code rate parity check matrix $H_{r0}$ 500. For example, if the highest code rate parity check matrix $H_{r0}$ 500 is full rank then the submatrix F 506 may also be full rank. This partitioning can be achieved by exchanging the appropriate circulant columns from the submatrix D 502 into one or more of the submatrices E and F 504, 506.

Figure 6:
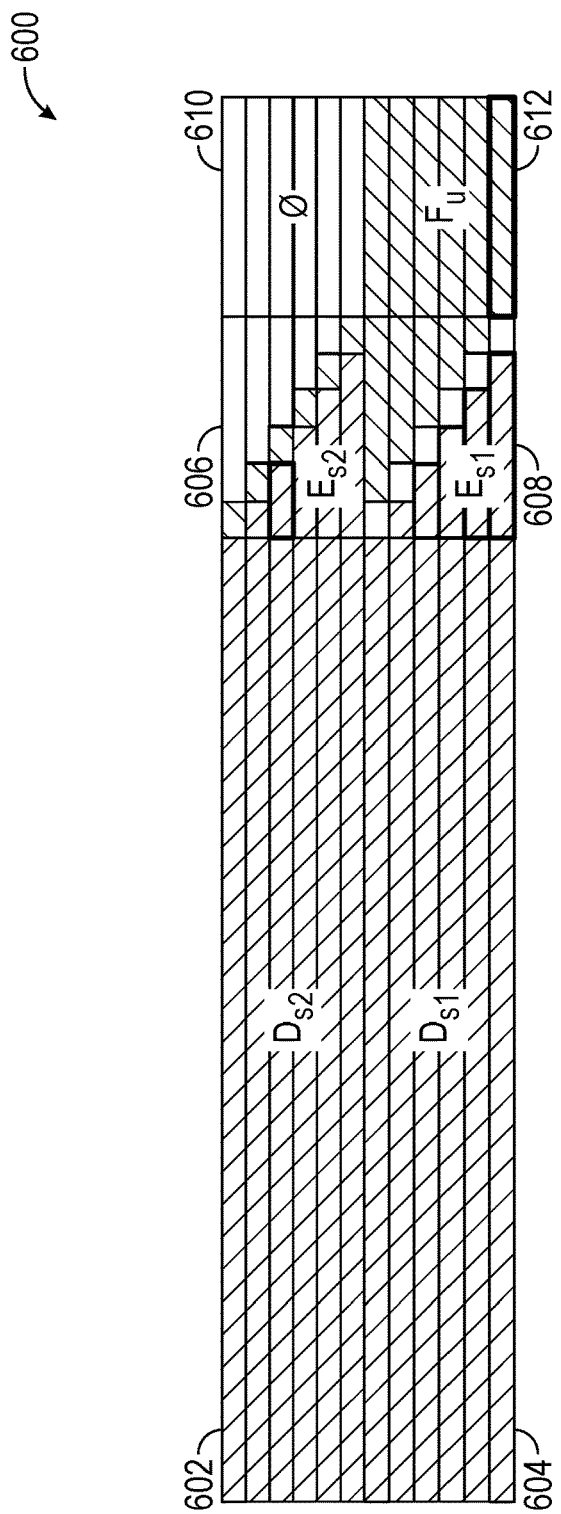
FIG. 6 illustrates a split parity check matrix partitioned into submatrices in a hierarchical variable code rate error correction coding system in accordance with one or more implementations.

FIG. 6 illustrates split highest code rate parity check matrix $H_{rF}$ 600 partitioned into submatrices in a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The split highest code rate parity check matrix $H_{rF}$ 600 includes a submatrix $D_{s2}$ 602, submatrix $E_{s2}$ 606, a Ø submatrix 610 (e.g. an all zeros submatrix), a submatrix $D_{s1}$ 604, a submatrix $E_{s1}$ 608, and a submatrix $F_U$ 612. The highest code rate parity check matrix $H_{r0}$ 500 may be split such that the circulants along the diagonal of submatrix $E_{s2}$ 606 are non-null, and the circulants above the diagonal in submatrix $E_{s2}$ 606 are null. Since the diagonal circulants of the submatrix E 504 are non-null, this pattern can be achieved when splitting the submatrix E 504. However, if the submatrix E 504 is not split in this manner, the large number of null circulants in the new matrix can be used to swap columns until this requirement is satisfied; any columns that are swapped should be swapped in the original highest code rate parity check matrix $H_{r0}$ 500 as well to maintain consistency. Alternatively, or in addition, columns can be swapped in the highest code rate parity check matrix $H_{r0}$ 500 before splitting so that there are no null circulants along the diagonal of the submatrix E 504. Then rows are split so that submatrix $E_{s2}$ 606 is lower triangular with no null circulants along its diagonal. The submatrix F 506 is not split and therefore the submatrix $F_U$ 612 is effectively equivalent to the submatrix F 506.

Figure 7:
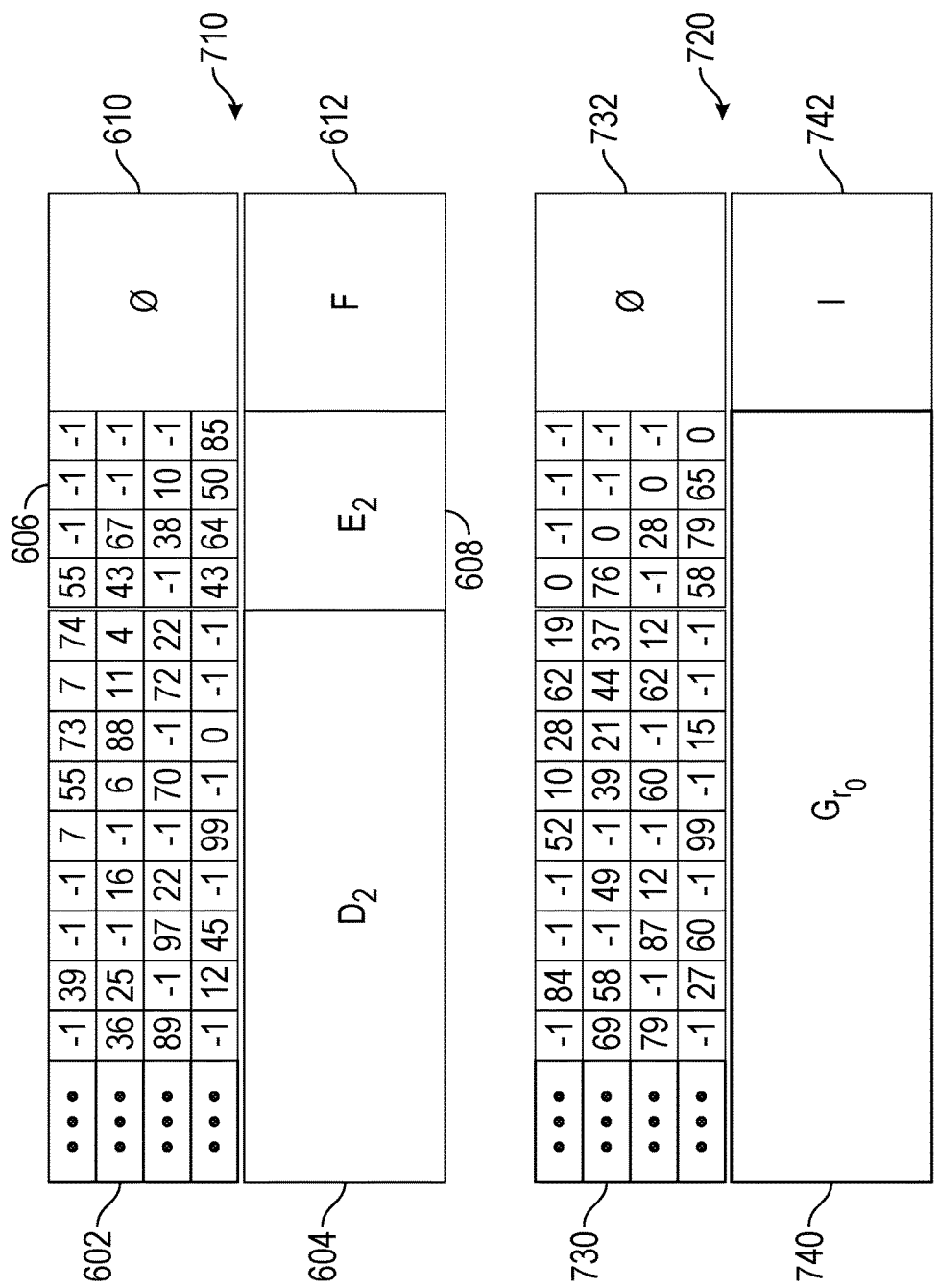
FIG. 7 illustrates an example split parity check matrix and a corresponding example generator matrix for an example circulant size of 100 in a hierarchical variable code rate error correction coding system in accordance with one or more implementations.

FIG. 7 illustrates an example split highest code rate parity check matrix $H_{rF}$ 710 and a corresponding example generator matrix $G_{rF}$ 720 for an example circulant size of 100 in a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example split highest code rate parity check matrix $H_{rF}$ 710 includes the submatrix $D_{s2}$ 602, the submatrix $E_{s2}$ 606, the Ø submatrix 610, the submatrix $D_{s1}$ 604, the submatrix $E_{s1}$ 608, and the submatrix $F_U$ 612. The example generator matrix $G_{rF}$ 720 includes a hierarchical portion 730, a base portion 740, a Ø submatrix 732 and an identity submatrix 742. The split highest code rate parity check matrix $H_{rF}$ 710 may be the highest code rate parity check matrix $H_{r0}$ 500 after a full split (e.g. splitting all rows).

In FIG. 7, circulants are shown; the number inside the square indicates the rightward shift from the identity matrix. Thus, 0 indicates the identity matrix, and 1 indicates a circulant which is an identity matrix that has been circularly shifted to the right by 1. Null matrices (all-zero matrices) are indicated by a −1. I and Ø represent the larger identity and all-zero matrices, respectively. For explanatory purposes, the circulant size used in FIG. 7 is 100—thus, the circulants have a shift number between 0 and 99.

To generate the first part of the generator matrix $G_{rF}$ 720, the circulants on the diagonal locations of the submatrix $E_{s2}$ 606 are converted to identity matrices (circulants with a 0 value). Other circulants on the row will be shifted circularly by the same amount. The lower half of the generator matrix $G_{rF}$ 720 (e.g. the base portion 740) is $G_{r0}$ the encoder matrix corresponding to the highest-rate parity check matrix $H_{r0}$ 500.

As is discussed above with respect to FIG. 2, after identifying the appropriate row of the hierarchical portion 730 to achieve a desired code rate, encoding is performed hierarchically one circulant row at a time from top to bottom until $G_{r0}$ (the base portion 740) is reached, at which point $G_{r0}$ is used to generate the final parities of the codeword. Thus, for any r, r<$r_0$, encoding begins at the row in which the length of the concatenated circulants before the rightmost identity matrix matches the size of the incoming data. The rows above this row are unused during such an encoding.

The starting row of the hierarchical portion 730 depends on the code rate; start on the highest row where the data bits do not overlap with the identity diagonal of the hierarchical portion 730 (which corresponds to the diagonal of the submatrix $E_{s2}$ 606 illustrated in FIG. 6), so that encoding for this row adds a single circulant-sized block of parity. Each circulant row adds one parity block that is the same size as a circulant, and the encoding process for the next circulant row will use this parity as part of its input. Thus, encoding for a rate between the minimum and maximum rates is almost the same; the primary difference being the row of the hierarchical portion 730 on which the encoding begins. The encoding should begin on the row of the hierarchical portion 730 that contains a circulant on the diagonal where the first parity needs to be computed.

Thus, the encoding algorithm can be summarized as follows: (1) encode data one circulant row at a time using shifted version of circulants in the hierarchical portion 730 of the generator matrix $G_{rF}$ 720; and (2) encode using $G_{r0}$ (the base portion 740), which is obtained from the highest code rate parity check matrix check matrix $H_{r0}$ 500. Since the hierarchical portion 730 is sparse, the base portion 740 is the only dense matrix used during the encoding.

Figure 8:
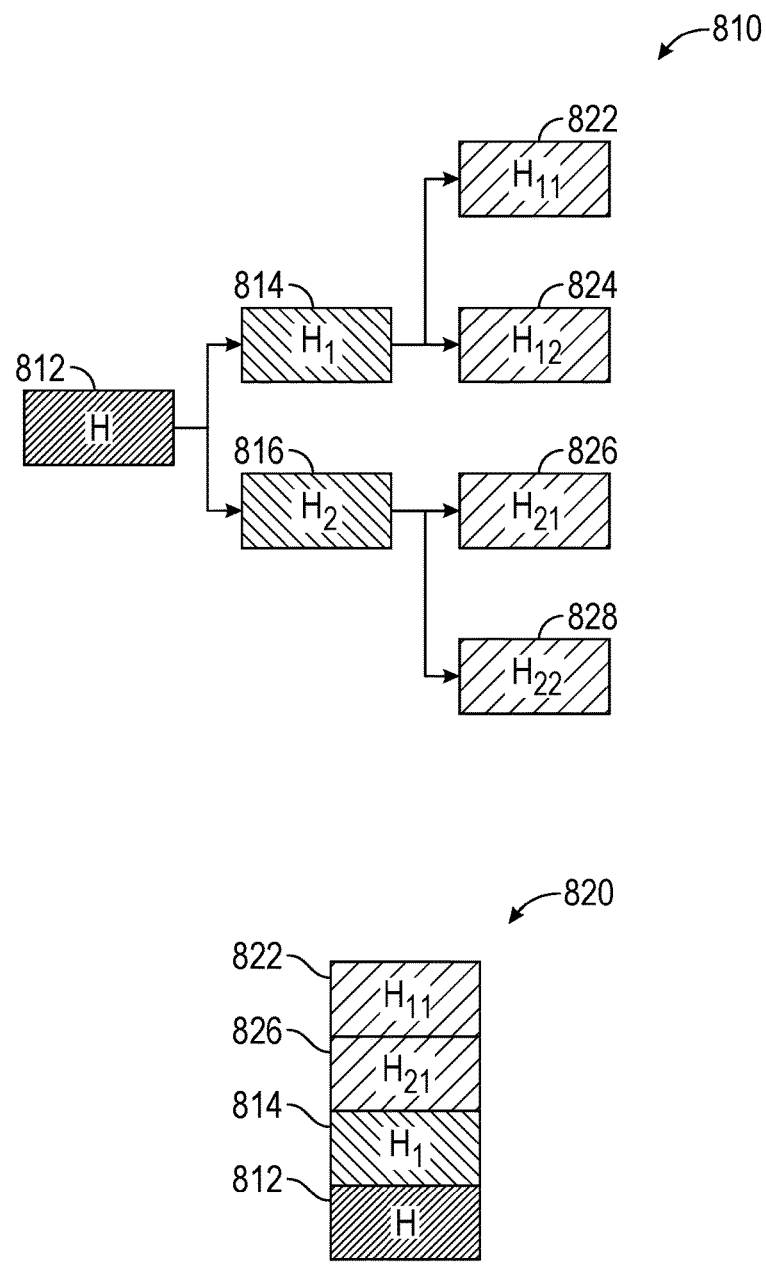
FIG. 8 illustrates an example multi-stage splitting tree and an example multi-stage arrangement in a hierarchical variable code rate error correction coding system in accordance with one or more implementations.

FIG. 8 illustrates an example multi-stage splitting tree 810 and multi-stage splitting arrangement 820 in a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example multi-stage splitting tree 810 illustrates that the originally designed matrix H 812 will be split into matrix $H_1$ 814 and matrix $H_2$ 816. Matrix $H_1$ 814 will be split into matrix $H_{11}$ 822 and matrix $H_{12}$ 824. Matrix $H_2$ 816 will be split into matrix $H_{21}$ 826 and matrix $H_{22}$ 828. The example multi-stage splitting arrangement 820 illustrates that the generator matrix (G matrix) used by the encoder 118 will be built from matrix $H_{11}$ 822, matrix $H_{21}$ 826 (results of second split), matrix $H_1$ 814 (result of first split) and the original designed matrix H 812.

The multi-stage splitting allows the range of code rates to be expanded and in one or more implementations, the rows of the highest code rate parity check matrix $H_{r0}$ 500 may be split any number of times, e.g. more than the number of times shown in FIG. 8. For example, for fixed length N of about 1 KB and circulant size of 96 bits, the code rates of interest (094-0.7) require the number of row circulants to change from 6 to 26, while the range is 10 to 50 circulant rows for a codeword length of about 2 KB. In both cases, in order to cover the wide range of code rates, the rows of the highest code rate parity check matrix $H_{r0}$ 500 may be split more than once.

Figure 9:
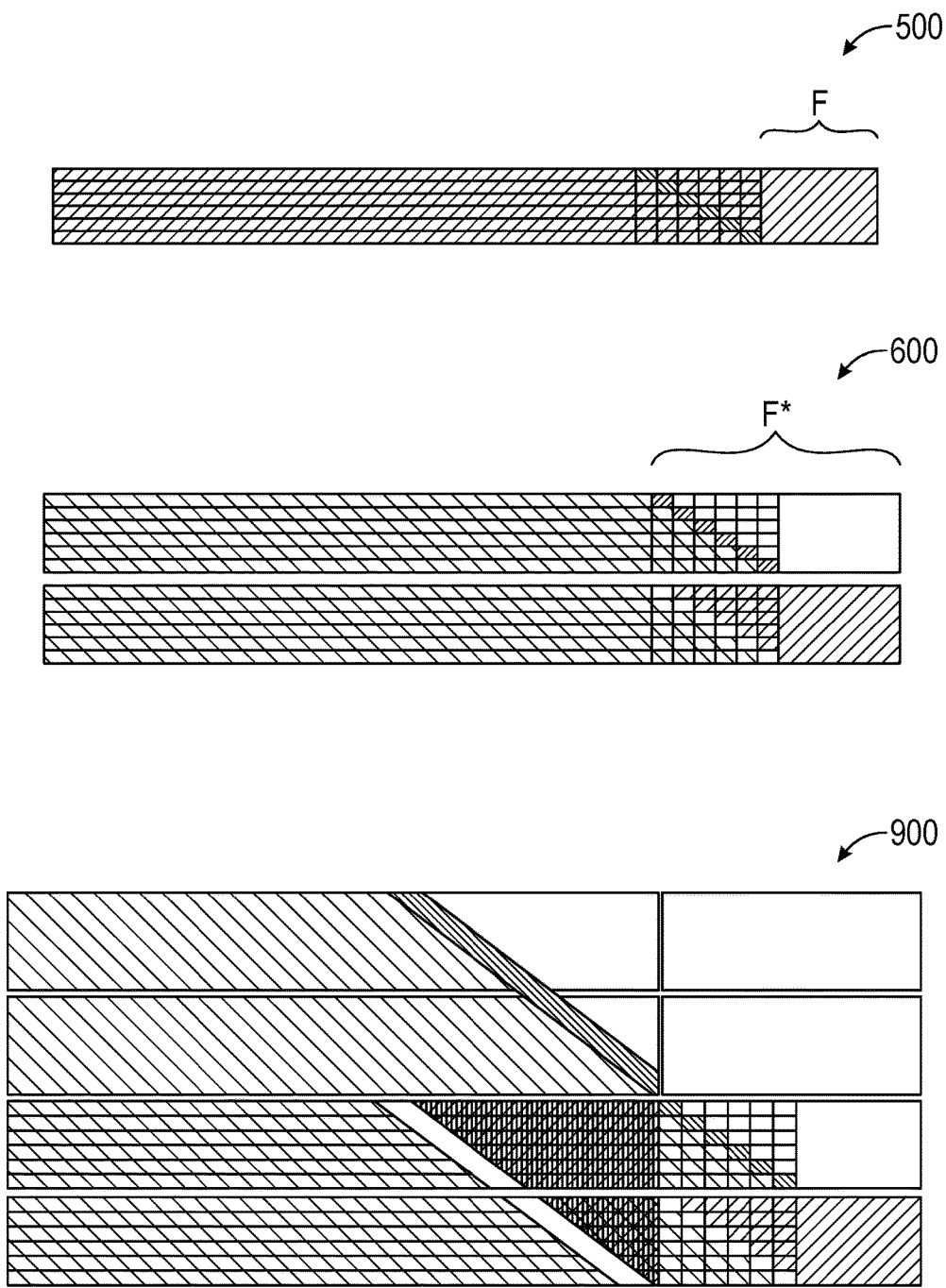
FIG. 9 illustrates an example highest code rate parity check matrix split multiple times in a hierarchical variable code rate error correction coding system in accordance with one or more implementations.

FIG. 9 illustrates an example highest code rate parity check matrix $H_{r0}$ split multiple times in a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein.

Additional components, different components, or fewer components may be provided.

In FIG. 9, the highest code rate parity check matrix $H_{r0}$ 500 and the split highest code rate parity check matrix $H_{rF}$ 600 correspond to the matrices discussed above with respect to FIGS. 5 and 6. For example, the split highest code rate parity check matrix $H_{rF}$ 600 is generated by splitting every row of the highest code rate parity check matrix $H_{r0}$ 500 one time.

The second split parity check matrix $H_{rFF}$ 900 can be generated by splitting the rows of the split highest code rate parity check matrix $H_{rF}$ 600 in the same manner as the rows of the highest code rate parity check matrix $H_{r0}$ 500 were split. The original condition that the submatrix F 506 be full rank translates to the condition that the submatrix F* be full rank, where the submatrix F* is the rightmost square matrix of matrix $H_{rF}$ 600, e.g., $$F^* = \begin{bmatrix} E_1 & 0 \\ E_2 & F \end{bmatrix}.$$

Since the submatrices E and F 504, 506 are both full rank, both submatrices E and F 504, 506 can be transformed into lower-triangular matrices with no zeroes along the diagonals. Thus, F* can also be transformed into a lower-triangular matrix with no zeroes along the diagonal, and so the condition that F* be full rank can be automatically met without further constraints.

Similar to splitting the highest code rate parity check matrix $H_{r0}$ 500, when splitting the split highest code rate parity check matrix $H_{rF}$ 600 the submatrix F* should not be split. The submatrix E* (analogous to the submatrix E 504 of the matrix $H_{r0}$ 500) should be upper triangular and have non-null circulants along its diagonal. This can be achieved by swapping circulant columns once splitting is complete until the constraint is met. If the columns are swapped in second split parity check matrix $H_{rFF}$ 900, the same columns should also be swapped in the split highest code rate parity check matrix $H_{rF}$ 600 and the highest code rate parity check matrix $H_{r0}$ 500 so that the code is consistent. Alternatively, columns can be swapped in the split highest code rate parity check matrix $H_{rF}$ 600 (and the highest code rate parity check matrix $H_{r0}$ 500) before splitting so that there are no null circulants along the diagonal of E*. Then the rows are split so that $E_1^*$ is lower-triangular with no nulls circulants along its diagonal.

Figure 10:
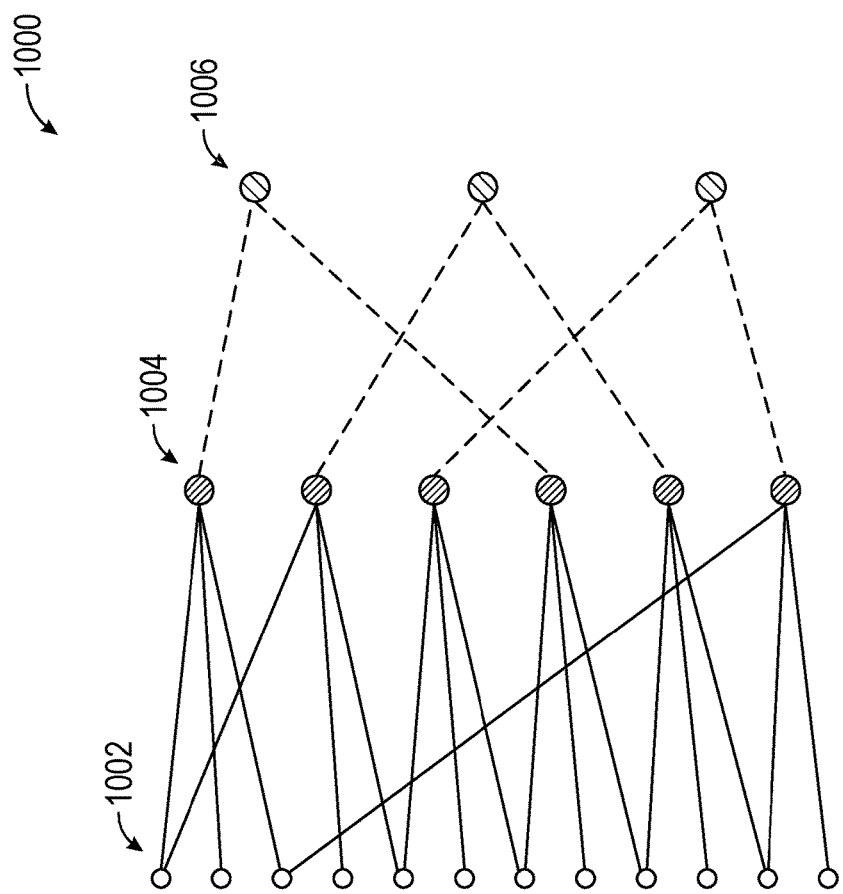
FIG. 10 illustrates an example tanner graph of an example decoder in a hierarchical variable code rate error correction coding system in accordance with one or more implementations.

FIG. 10 illustrates an example tanner graph 1000 of an example decoder in a hierarchical variable code rate error correction coding system in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example tanner graph 1000 includes digit nodes 1002, first subcode nodes 1004, and second subcode nodes 1006. The digit nodes 1002 may correspond to the columns of the parity check matrix $H_{r0}$ 500, while the second subcode nodes 1006 may correspond to the rows of the highest code rate parity check matrix $H_{r0}$ 500. Thus, the first subcode nodes 1004 may correspond to the rows that have been split from the highest code rate parity check matrix $H_{rF}$ 600. Accordingly, the decoder 116 of the controller 114 may be configured to account for combining the first subcode nodes 1004 to form the second subcode nodes 1006 which in turn correspond to the rows of the highest code rate parity check matrix $H_{rF}$ 600.

Figure 11:
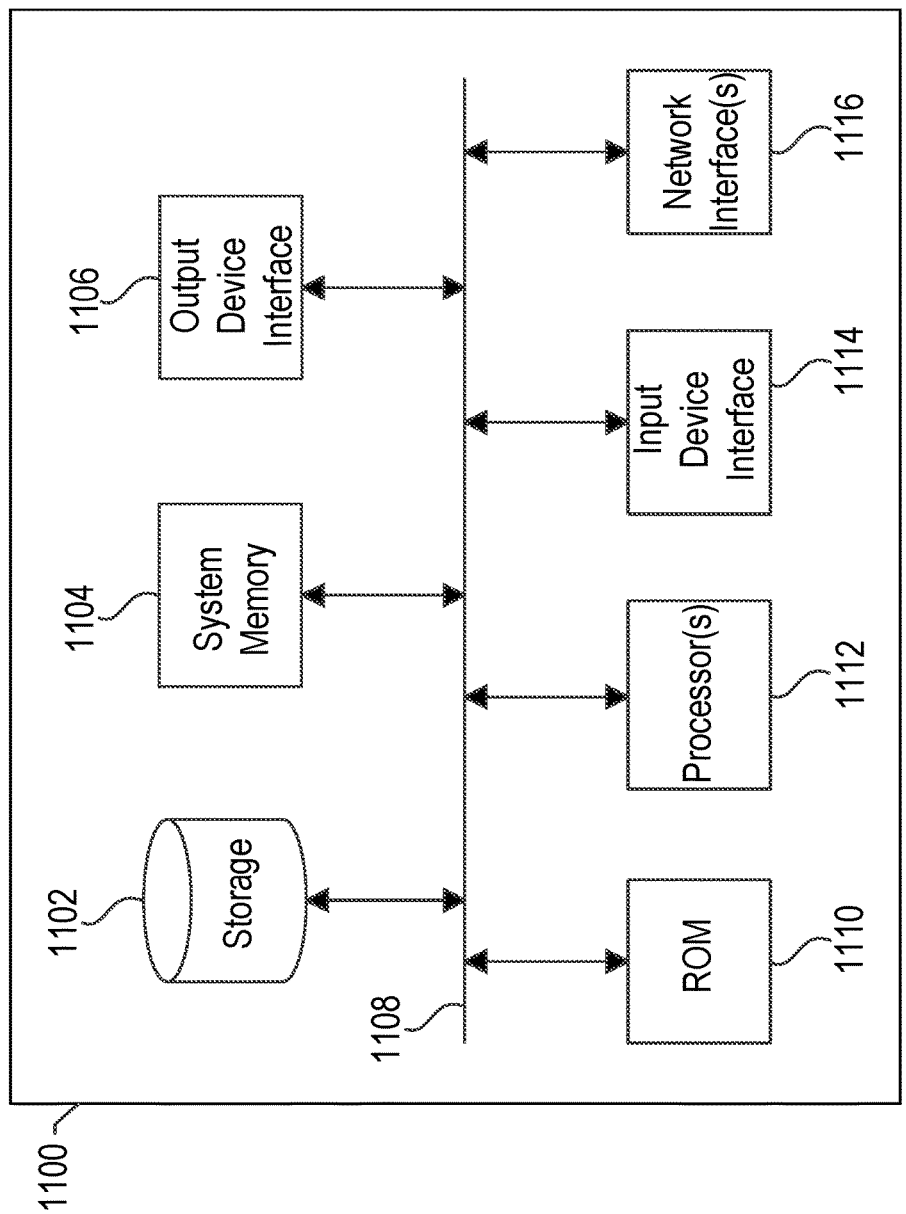
FIG. 11 conceptually illustrates an electronic system with which one or more implementations of the subject technology may be implemented.

FIG. 11 conceptually illustrates an electronic system 1100 with which one or more implementations of the subject technology may be implemented. Such an electronic system 1100 includes various types of computer readable media and interfaces for various other types of computer readable media. The electronic system 1100 includes a bus 1108, one or more processor(s) 1112, a system memory 1104 or buffer, a read-only memory (ROM) 1110, a permanent storage device 1102, an input device interface 1114, an output device interface 1106, and one or more network interface(s) 1116, or subsets and variations thereof.

The bus 1108 collectively represents all system, peripheral, and chipset buses that communicatively connect the numerous internal devices of the electronic system 1100. In one or more implementations, the bus 1108 communicatively connects the one or more processor(s) 1112 with the ROM 1110, the system memory 1104, and the permanent storage device 1102. From these various memory units, the one or more processor(s) 1112 retrieve instructions to execute and data to process in order to execute the processes of the subject disclosure. The one or more processor(s) 1112 can be a single processor or a multi-core processor in different implementations.

The ROM 1110 stores static data and instructions that are needed by the one or more processor(s) 1112 and other modules of the electronic system 1100. The permanent storage device 1102, on the other hand, may be a read-and-write memory device. The permanent storage device 1102 may be a non-volatile memory unit that stores instructions and data even when the electronic system 1100 is off. In one or more implementations, a mass-storage device (such as a magnetic or optical disk and its corresponding disk drive) may be used as the permanent storage device 1102.

In one or more implementations, a removable storage device (such as a floppy disk, flash drive, and its corresponding disk drive) may be used as the permanent storage device 1102. Like the permanent storage device 1102, the system memory 1104 may be a read-and-write memory device. However, unlike the permanent storage device 1102, the system memory 1104 may be a volatile read-and-write memory, such as random access memory. The system memory 1104 may store any of the instructions and data that one or more processor(s) 1112 may need at runtime. In one or more implementations, the processes of the subject disclosure are stored in the system memory 1104, the permanent storage device 1102, and/or the ROM 1110. From these various memory units, the one or more processor(s) 1112 retrieve instructions to execute and data to process in order to execute the processes of one or more implementations.

The bus 1108 also connects to the input and output device interfaces 1114 and 1106. The input device interface 1114 enables a user to communicate information and select commands to the electronic system 1100. Input devices that may be used with the input device interface 1114 may include, for example, alphanumeric keyboards and pointing devices (also called "cursor control devices"). The output device interface 1106 may enable, for example, the display of images generated by the electronic system 1100. Output devices that may be used with the output device interface 1106 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

As shown in FIG. 11, the bus 1108 also couples the electronic system 1100 to one or more networks (not shown) through one or more network interface(s) 1116. One or more network interface(s) may include an Ethernet interface, a WiFi interface, a Bluetooth interface, a cellular interface, a power line interface, a multimedia over coax alliance (MoCA) interface, a reduced gigabit media independent interface (RGMII), or generally any interface for connecting to a network. The one or more network interfaces 1116 may include, or may be coupled to, a physical layer module. In this manner, the electronic system 1100 can be a part of one or more networks of computers (such as a local area network ("LAN"), a wide area network ("WAN"), or an Intranet, or a network of networks, such as the Internet. Any or all components of the electronic system 1100 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, race-track memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device comprising:
   at least one circuit configured to:
   identify a row of a hierarchical portion of a generator matrix that corresponds to a determined code rate, wherein rows below the identified row correspond to one or more smaller code rates that are less than the determined code rate;
   determine a number of information bits to apply to the hierarchical portion of the generator matrix based at least on the identified row;
   apply the determined number of information bits to the identified row of the hierarchical portion of the generator matrix;
   apply an output of the identified row of the hierarchical portion of the generator matrix to a subsequent row, from top to bottom, of the hierarchical portion of the generator matrix, when the hierarchical portion of the generator matrix comprises the subsequent row;
   apply an output of a last row, from top to bottom, of the hierarchical portion of the generator matrix to a base portion of the generator matrix; and
   provide a codeword output by the base portion of the generator matrix;
   wherein the at least one circuit is thereby configured to identify the rows below the identified row to provide codeword outputs for the one or more smaller code rates without accessing another generator matrix separate from the generator matrix.

2. The device of claim 1, wherein the at least one circuit is further configured to:
   determine the number of information bits based at least in part on a number of non-null circulants in the identified row.

3. The device of claim 1, wherein the at least one circuit is further configured to:
   identify a bit error rate associated with at least one data transfer operation; and
   determine a code rate associated with the identified bit error rate.

4. The device of claim 3, wherein the at least one data transfer operation comprises writing data to at least one flash memory, and the at least one circuit is further configured to:
   write the codeword output to the at least one flash memory.

5. The device of claim 4, wherein the code rate decreases as the bit error rate increases.

6. The device of claim 3, wherein the at least one data transfer operation comprises wirelessly transmitting data over a network.

7. The device of claim 3, wherein the at least one circuit is further configured to:
   detect a change in the bit error rate;
   determine an adjusted code rate associated with the changed bit error rate;
   identify another row of the hierarchical portion of the generator matrix that corresponds to the adjusted code rate;
   determine another number of information bits to apply to the hierarchical portion of the generator matrix based at least on the identified another row;
   apply the determined another number of information bits to the identified another row of the hierarchical portion of the generator matrix;
   apply the output of the identified another row of the hierarchical portion of the generator matrix to another subsequent row of the hierarchical portion of the generator matrix, when the hierarchical portion of the generator matrix comprises the another subsequent row;
   apply another output of the last row of the hierarchical portion of the generator matrix to the base portion of the generator matrix; and
   provide another codeword output by the base portion of the generator matrix.

8. The device of claim 7, wherein the adjusted code rate differs from the code rate, the another number of information bits differs from the number of information bits, the identified another row differs from the identified row, and a first length of the codeword output equals a second length of the another codeword output.

9. The device of claim 1, wherein the at least one circuit is further configured to:
generate a highest code rate parity check matrix;
partition the highest code rate parity check matrix into three submatrices;
split each row of the highest code rate parity check matrix to generate three additional submatrices;
generate the hierarchical portion of the generator matrix by shifting circulants along a diagonal of at least one of the submatrices to each be an identity matrix and shifting other circulants within each row by a corresponding amount; and
generate the base portion of the generator matrix from the highest code rate parity check matrix.

10. The device of claim 9, wherein at least one of the three additional submatrices comprises all zeros.

11. The device of claim 1, wherein the at least one circuit is further configured to:
apply the output of the subsequent row of the hierarchical portion of the generator matrix to another subsequent row of the hierarchical portion of the generator matrix, when the hierarchical portion of the generator matrix comprises the another subsequent row.

12. A computer program product comprising instructions stored in a non-transitory computer-readable storage medium, the instructions comprising:
instructions to receive a number of information bits;
instructions to apply the information bits to a row of a plurality of rows of a generator matrix, the row corresponding to the number of information bits, wherein rows below the row correspond to smaller numbers of bits than the number of information bits;
instructions to apply an output of the row of the plurality of rows of the generator matrix to a subsequent row of the plurality of rows of the generator matrix when the generator matrix comprises the subsequent row of the plurality of rows;
instructions to repeat applying the output of each row to each subsequent row until a last row of the plurality of rows of the generator matrix is reached; and
instructions to provide a codeword output by the last row of the plurality of rows of the generator matrix;
wherein the instructions thereby enable the instructions to receive the smaller numbers of bits to provide codeword outputs for the smaller numbers of bits without accessing another generator matrix separate from the generator matrix.

13. The computer program product of claim 12, wherein the instructions further comprise:
instructions to identify a bit error rate associated with at least one data transfer operation;
instructions to determine a code rate associated with the identified bit error rate;
instructions to identify the row of the plurality of rows of the generator matrix that corresponds to the determined code rate; and
instructions to determine the number of information bits based at least in part on the identified row.

14. The computer program product of claim 13, wherein the instructions to determine the number of information bits further comprises:
instructions to determine the number of information bits based at least in part on a number of non-null circulants in the identified row.

15. The computer program product of claim 13, wherein the at least one data transfer operation comprises writing data to at least one flash memory, and the instructions further comprise:
instructions to write the codeword output to the at least one flash memory.

16. The computer program product of claim 13, wherein the instructions further comprise:
instructions to generate a highest code rate parity check matrix;
instructions to partition the highest code rate parity check matrix into three submatrices;
instructions to split each row of the highest code rate parity check matrix to generate three additional submatrices;
instructions to generate a first portion of the generator matrix by shifting circulants along a diagonal of at least one of the submatrices to each be an identity matrix and shifting other circulants within each row by a corresponding amount; and
instructions to generate a base portion of the generator matrix from the highest code rate parity check matrix.

17. A method comprising:
determining a highest code rate associated with at least one data transfer operation;
generating a highest code rate parity check matrix based at least in part on the determined highest code rate;
partitioning the highest code rate parity check matrix into three submatrices;
splitting each row of the highest code rate parity check matrix to generate three additional submatrices;
generating a first portion of a generator matrix by shifting circulants along a diagonal of at least one of the three additional submatrices to each be an identity matrix and shifting other circulants within each row by a corresponding amount;
generating a second portion of the generator matrix from the highest code rate parity check matrix; and
storing the generator matrix in at least one flash memory circuit;
wherein the first portion of the generator matrix thereby enables an identification of a plurality of rows, corresponding to a plurality of code rates up to the highest code rate, for starting an encoding to generate corresponding codewords of the plurality of code rates, wherein the encoding is without accessing another generator matrix separate from the generator matrix.

18. The method of claim 17, further comprising:
applying a number of information bits to the generator matrix to generate at least one codeword; and
providing the at least one codeword.

19. The method of claim 18, wherein applying the number of information bits to the generator matrix to generate the at least one codeword further comprises:
identifying a bit error rate associated with at least one data transfer operation;
determining a code rate associated with the identified bit error rate;
identifying a row of the first portion of the generator matrix that corresponds to the determined code rate;
determining the number of information bits to apply to the first portion of the generator matrix based at least on the identified row;

applying the determined number of information bits to the identified row of the first portion of the generator matrix;

applying an output of the identified row of the first portion of the generator matrix to a subsequent row of the first portion of the generator matrix, when the first portion of the generator matrix comprises the subsequent row; and applying an output of a last row of the first portion of the generator matrix to the second portion of the generator matrix to generate the at least one codeword.

20. The method of claim 19, wherein the at least one data transfer operation comprises writing data to at least one flash memory, and the method further comprises:

writing the codeword to the at least one flash memory.

* * * * *